United States Patent
Starr

(10) Patent No.: US 6,812,756 B2
(45) Date of Patent: Nov. 2, 2004

(54) PLL/DLL CIRCUITRY PROGRAMMABLE FOR HIGH BANDWIDTH AND LOW BANDWIDTH APPLICATIONS

(75) Inventor: Greg Starr, San Jose, CA (US)

(73) Assignee: Altera Corporation, San Jose, CA (US)

( * ) Notice: Subject to any disclaimer, the term of this patent is extended or adjusted under 35 U.S.C. 154(b) by 3 days.

(21) Appl. No.: 10/669,295

(22) Filed: Sep. 23, 2003

(65) Prior Publication Data

US 2004/0056695 A1 Mar. 25, 2004

Related U.S. Application Data

(62) Division of application No. 10/137,802, filed on May 1, 2002, now Pat. No. 6,633,185.
(60) Provisional application No. 60/329,896, filed on Oct. 16, 2001.

(51) Int. Cl.[7] .................................................. H03L 7/06
(52) U.S. Cl. ..................... 327/157; 327/160; 327/117; 377/47
(58) Field of Search .......................... 327/113, 115–117, 327/156, 157, 160; 377/47, 48

(56) References Cited

U.S. PATENT DOCUMENTS

| | | | | |
|---|---|---|---|---|
| 4,633,194 A | * | 12/1986 | Kikuchi et al. | 331/25 |
| 4,862,485 A | * | 8/1989 | Guinea et al. | 375/376 |
| 5,036,216 A | * | 7/1991 | Hohmann et al. | 327/157 |
| 5,257,294 A | * | 10/1993 | Pinto et al. | 375/376 |
| 5,453,706 A | | 9/1995 | Yee | 326/93 |
| 5,689,195 A | | 11/1997 | Cliff et al. | 326/41 |
| 5,744,991 A | | 4/1998 | Jefferson et al. | 327/158 |
| 5,909,126 A | | 6/1999 | Cliff et al. | 326/41 |
| 6,046,603 A | | 4/2000 | New | 326/38 |
| 6,057,704 A | | 5/2000 | New et al. | 326/38 |
| 6,091,263 A | | 7/2000 | New et al. | 326/40 |
| 6,177,844 B1 | | 1/2001 | Sung et al. | 331/25 |
| 6,181,158 B1 | | 1/2001 | Cheung et al. | 326/38 |
| 6,215,326 B1 | | 4/2001 | Jefferson et al. | 326/41 |
| 6,218,876 B1 | | 4/2001 | Sung et al. | 327/156 |
| 6,252,419 B1 | | 6/2001 | Sung et al. | 327/156 |
| 6,456,132 B1 | * | 9/2002 | Kouzuma | 327/159 |
| 6,633,185 B2 | * | 10/2003 | Starr | 327/157 |

OTHER PUBLICATIONS

XILINX, XC4000E and XC4000X Series Field Programmable Gate Arrays, product information, May 14, 1999, Version 1.6, 6–5 to 6–35.

(List continued on next page.)

Primary Examiner—Timothy P. Callahan
Assistant Examiner—An T. Luu
(74) Attorney, Agent, or Firm—Morrison & Foerster LLP

(57) ABSTRACT

An integrated circuit including a phase lock loop or delay lock loop (PLL/DLL) circuit comprising: a clock input terminal for accepting a clock signal; a phase/frequency detector (PFD) circuit including a reference clock input connected to the clock input terminal and including a PFD feedback input and including a PFD output; a charge pump (CP) circuit; at least one external feedforward output terminal; a loop filter (LF); a loop controlled signal source (LCSS); and a feedback circuit connected between a LCSS output and the PFD feedback input, the feedback circuit including, an external feedback input terminal; first frequency selection circuitry to produce a first programmable feedback signal; second frequency selection circuitry to produce a second feedback signal; and multiplex circuitry connected with the LCSS output, the external feedback input terminal and the first and second frequency selection circuitry, to cause either the first programmable feedback signal or the second programmable feedback signal to be coupled to the PFD feedback input.

5 Claims, 9 Drawing Sheets

OTHER PUBLICATIONS

XILINX, Virtex™–E 1.8 V, Field Programmable Gate Arrays, product description, Jul. 23, 2001, 7 pgs.

A. Mansukhani, "Phase Lock Loop Stability Analysis", Applied Microwave & Wireless, 2000, pp. 30–38.

M. H. Perrott et al., "A 27–mW CMOS Fractional–N Synthesizer Using Digital Compensation for 2.5–Mb/s GFSK Modulation", IEEE J. of Solid State Circuits, vol. 32, No. 12, Dec. 1997, 13 pgs.

Altera, "Phase–Locked Loop (PLL) and LVDS Support in APEX 20KE Devices", Marketing Bulletin #276, Jan. 2000, 3 pgs.

Texas Instruments, "Low–Voltage 1.2 GHz Fractional–N/Integer–N Synthesizer", TRF 2050, 34 pgs., 6/96 revised Oct. 2000.

B. Hazavi, RF Microelectronics, "RF Synthesizer Architectures", 1998, pp. 270–280.

* cited by examiner

PLL/DLL CIRCUITRY PROGRAMMABLE FOR HIGH BANDWIDTH AND LOW BANDWIDTH APPLICATIONS

CROSS-REFERENCE TO RELATED APPLICATIONS

This application is a divisional of Application No. 10/137, 802, filed May 1, 2002, U.S. Pat. No. 6,633,185 which claims priority of provisional Application No. 60/329,896, filed Oct. 16, 2001, the entire contents of which are incorporated herein by reference.-

BACKGROUND OF THE INVENTION

1. Field of the Invention

The invention relates in general to integrated circuits, and more particularly, to integrated circuits that include phase lock loop circuits or delay lock loop circuits.

2. Description of the Related Art

Integrated circuits often employ phase-locked loop (PLL) or delay-locked loop (DLL) circuitry to synthesize a clock signal frequency from a reference clock signal. A programmable logic device is a type of integrated circuit that can use a PLL or DLL to generate a clock signal at a desired frequency and also to help counteract clock skew and excessive delay in clock signals propagating within the device. For convenience herein PLL and DLL circuitry is sometimes referred to generically herein as PLL/DLL circuitry. Sung et al. U.S. Pat. No. 6,252,419; Sung et al. U.S. Pat. No. 6,218,876; and Sung et al. U.S. Pat. No. 6,177,844; and Jefferson et al. U.S. Pat. No. 5,744,991 which describe the use of PLL/DLL circuits in integrated circuits, particularly in programmable logic device integrated circuits, are expressly incorporated herein by this reference.

PLL/DLL circuits typically include a loop filter. One function of a loop filter is to filter out high frequency harmonics in the loop. Another function of the loop filter is to stabilize the loop. The loop filter also affects loop response parameters such as loop bandwidth, loop time response and the damping factor of the loop.

The loop bandwidth influences PLL/DLL circuit responsiveness to changes in reference clock signal frequency. A higher loop bandwidth results in a PLL/DLL that is more rapidly responsive. A lower loop bandwidth results in a PLL/DLL that is less rapidly responsive. In some applications, it is desirable for the PLL/DLL to be highly responsive to changes in reference clock signal frequency. In other applications it is desirable for the loop filter to less responsive to changes in the reference clock signal frequency.

A higher bandwidth loop filter is more desirable where a more quickly responsive PLL/DLL is required. For example, certain memory modules typically employ a PLL/DLL circuit to control timing of memory access signals. Generally, it is desirable to employ a PLL/DLL with a higher bandwidth in such memory modules so that the PLL/DLL responds more rapidly to rapid changes in the reference clock signal. This responsiveness contributes to the achievement of high-speed access to memory.

A lower bandwidth loop filter is more desirable where a less quickly responsive PLL/DLL is required. For instance, in some systems it is not unusual to experience reference clock jitter. Such reference clock jitter can be regarded as a form of electronic noise. In some such systems it is important that a PLL/DLL phase-locked to a reference clock not be overly responsive to reference clock jitter or noise. For example, in video applications, a PLL/DLL that is too responsive to a jittery reference clock can result in a flickering distortion of an image displayed on a video screen. As another example, in certain radio frequency (RF) communications systems it is important that a PLL/DLL synthesize an output clock signal frequency that remains within a relatively narrow frequency range despite reference clock jitter or other noise sources. For instance, in an RF communications system compliant with the IS-54A standard, the lower end frequency range is 869 MHz, and the channel frequency spacing is 30 kHz. Thus, it is important that a PLL/DLL used to synthesize a clock signal within given relatively narrow channel have the ability to remain locked within a desired channel despite clock jitter.

In view of the wide range of PLL/DLL circuitry applications, there has been an increasing need for more versatile PLL/DLL circuitry. One problem with providing such PLL/DLL circuitry is that while a high bandwidth loop filter typically is small enough to fit on the same integrated circuit as the PLL/DLL circuitry, a low bandwidth loop filter often is too large to fit on one integrated circuit with other PLL/DLL components. Another problem is that feedback circuitry typically employed in PLL/DLLs used in some general purpose high bandwidth applications typically is different from feedback circuitry ordinarily employed in other lower bandwidth applications such as RF communications, for example. Despite these problems, the present invention meets the need for an integrated circuit with PLL/DLL circuitry that is adaptable to high bandwidth and to low bandwidth applications.

SUMMARY OF THE INVENTION

The present invention provides an integrated circuit including phase lock loop or delay lock loop (PLL/DLL) circuitry. The PLL/DLL circuitry has feedforward circuitry which includes a phase/frequency detector (PFD) circuit including a reference clock input connected to a clock input terminal and a PFD feedback input and a PFD output. The PLL/DLL feedforward circuit also includes a charge pump (CP) circuit, a loop filter (LF) and a loop controlled signal source (LCSS). The PLL/DLL circuitry further includes a feedback circuit connected between a LCSS output and the PFD feedback input. The feedback circuit includes an external feedback input terminal The feedback circuitry also includes first frequency selection circuitry to produce a first programmable feedback signal and second frequency selection circuitry to produce a second feedback signal. The feedback circuitry includes multiplex circuitry connected with the LCSS output, the external feedback input terminal and the first and second frequency selection circuitry, to cause either the first programmable feedback signal or the second programmable feedback signal to be coupled to the PFD feedback input. Moreover, the PLL/DLL circuitry includes at least one external feedforward output terminal which is connectable to an external PLL/DLL feedforward circuit component.

The external feedforward output terminal can be used to connect the PLL/DLL circuitry as part of a hybrid PLL/DLL circuit that includes external feedforward components, such as an external loop filter, for example. The multiplex circuitry can be used to switchably couple the first or second feedback signals to the PFD input depending upon the application of the PLL/DLL circuitry. For example, on the one hand, if the PLL/DLL circuitry is connected with an physically large external low bandwidth loop filter, then the multiplex circuitry can be switched to couple to the PFD input the one of the first and second feedback signals most suitable for low bandwidth applications. On the other hand, if the PLL/DLL circuitry is connected with a higher bandwidth on-chip loop filter, then the multiplex circuitry can be switched to couple to the PFD input the one of the first and second feedback signals most suitable for high bandwidth applications.

Therefore, the present invention meets the need for an integrated circuit with PLL/DLL circuitry that is adaptable to high bandwidth and to low bandwidth applications.

DETAILED DESCRIPTION OF THE PREFERRED EMBODIMENTS

The present invention provides an integrated circuit including PLL/DLL circuitry which is programmable for high bandwidth and low bandwidth for RF applications. In one aspect of the invention, the PLL/DLL circuit itself is programmably reconfigurable to functionally substitute external (off-chip) PLL/DLL circuit components in place of internal (on-chip) PLL/DLL circuit components as may be required to generate RF clock signals. In another aspect of the invention, the PLL/DLL circuitry includes feedback circuitry that is differently programmable for high bandwidth and low bandwidth applications. The following description is presented to enable any person skilled in the art to make and use the invention. The embodiments of the invention are described in the context of particular applications and their requirements. These descriptions of specific applications are provided only as examples. Various modifications to the preferred embodiments will be readily apparent to those skilled in the art, and the generic principles defined herein may be applied to other embodiments and applications without departing from the spirit and scope of the invention. Thus, the present invention is not intended to be limited to the embodiments shown, but is to be accorded the widest scope consistent with the principles and features disclosed herein.

Figure 1:
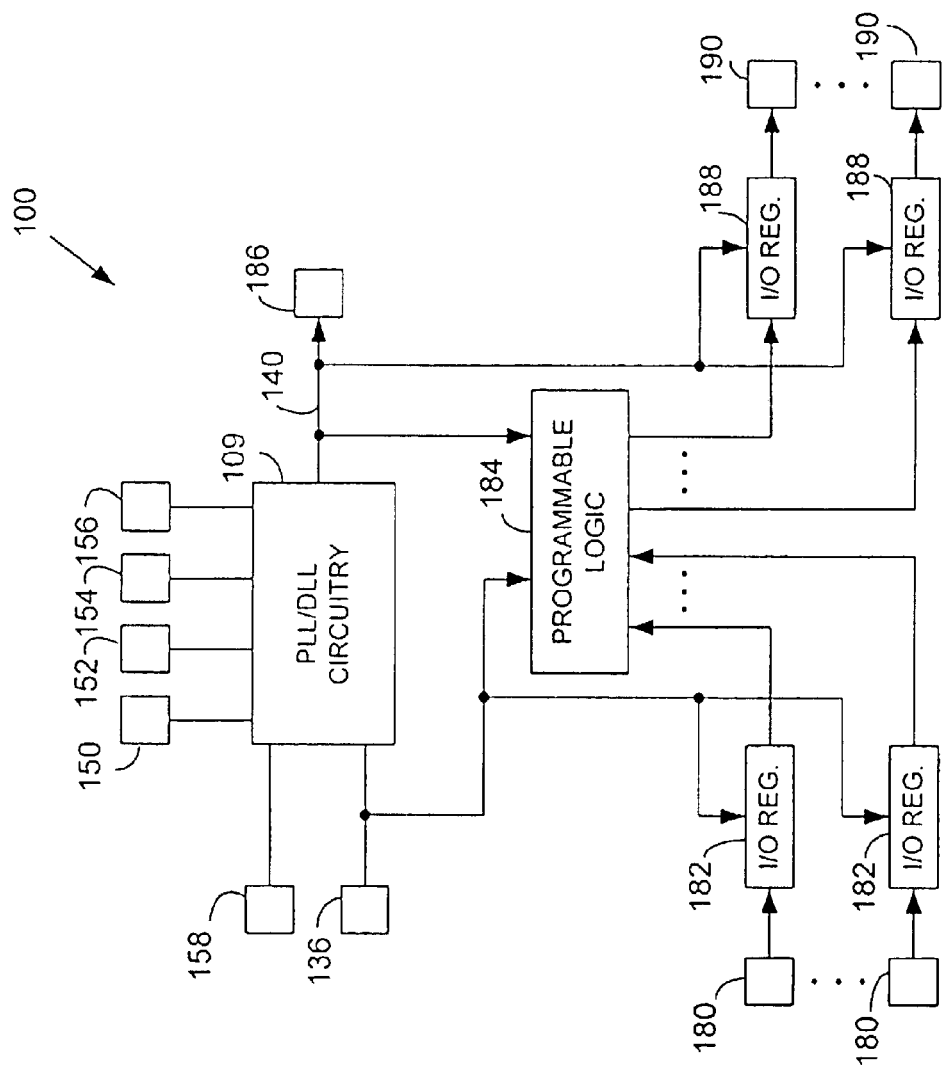
FIG. 1 is an illustrative generalized block diagram of an integrated circuit (IC) which includes phase lock loop PLL/DLL circuitry in accordance with a present embodiment of the invention.

The illustrative drawing of FIG. 1 shows an integrated circuit (IC) 100 which includes a phase lock loop (PLL) circuitry or alternatively, delay lock loop (DLL) circuitry (hereinafter, PLL/DLL) 109 constructed in accordance with a present embodiment of the invention. The integrated circuit 100 of FIG. 1 is a type of IC commonly referred to as a programmable logic device (PLD). It will be appreciated that although the PLL/DLL 109 is described in relation to its interconnection with and use as part of a PLD-type IC, the invention is not limited to PLD ICs. The IC 100 includes a clock input terminal 136 for receiving a clock signal from circuitry external to the IC 100. The IC also includes a plurality of input/output (I/O) terminals 180 for receiving data and/or control signals from external circuitry via registers 182. (For convenience herein, all data and control signals other than clock signals shall be referred to simply as data signals.) The data signals from terminals 180 may be applied to I/O registers 182 for temporary storage and output by those registers. The input clock signal applied to clock terminal 136 may be applied to I/O registers 182 to control the operation (in particular, the timing operation) of those registers. The data signals input by registers 182 are applied to programmable logic 184 of the PLD IC 100. (As an alternative to using registers 182, data from terminals 180 may be applied more directly to logic 184 (i.e., without first being registered by the registers 182).) Programmable logic 184 also typically receives the input clock signal from terminal 136 and generally performs at least some operations on the input data from terminals 182 at one or more rates determined by the frequency of the clock signal from terminal 136. For example, some or all of the data applied to terminals 180 may be synchronized with the clock signal applied to terminal 136, and programmable logic 184 may partially process that data also in synchronism with the clock signal applied to terminal 136.

The input clock signal applied to terminal 136 is also applied to PLL/DLL 109. The PLL/DLL 109 can be programmed to provide a modified clock output signal which has a defined frequency relationship to the input clock signal. For example, the frequency of the of the modified clock output signal produced by the PLL/DLL 109 may be higher or lower than the input clock frequency applied to terminal 136. The modified clock signal produced by the PLL/DLL 109 on line 140 may be applied to any or all of a modified clock output terminal 186, programmable logic 184 and I/O registers 188. Programmable logic 184 typically performs at least some data processing at one or more rates determined by the modified clock signals produced by the PLL/DLL 109. For example, programmable logic 184 may perform some data processing in synchronism with the modified clock signal produced by PLL/DLL 109. Output data signals may be applied to data terminals 190 via I/O registers 188, which may register those signals on the way to and from those terminals 190 at the modified clock signal rate. Thus, the IC 100 may output data via terminals 190 at the modified clock signal frequency and in synchronism with the modified clock signal applied to the output clock terminal 186.

A present embodiment of the PLL/DLL circuitry 109 also includes an externally accessible Phase/Frequency Detector (PFD) output terminals 150, 152 externally accessible Charge Pump (CP) output terminal 154 and an externally accessible Loop Controlled Signal Source (LCSS) terminal 156. Each of these externally accessible terminals is connected to a corresponding component of a feedforward circuit of the PLL/DLL 109. The PLL/DLL 109 also includes an external feedback input terminal 158. These externally accessible terminals are individually connectable to external PLL/DLL feedforward circuit components to implement a hybrid PLL/DLL circuit comprising on-chip and external (off-chip) components, for low bandwidth applications, for example.

Although FIG. 1 may appear to show fixed interconnections among the various circuit elements, it will be understood that in IC such as IC PLD device 100, there is typically a high degree of programmability and therefore signal routing flexibility in the interconnection resources that are provided. This programmability of interconnection resources, which is well known to those in the art, is not shown in the drawings herein to avoid unnecessarily complicating the drawings. Thus not all of the interconnections shown in FIG. 1 may be present in all uses of IC 100 and/or other interconnections not shown in FIG. 1 may be present in some uses of IC 100. Those skilled in the art will also appreciate that the circuit elements and interconnection resources shown in FIG. 1 may be only a part of more extensive circuit element and interconnection resources provided on IC 100. Moreover, it will be appreciated that the PLL/DLL block 109 may comprise more than one PLL/DLL circuit. Examples of programmable logic devices in which the present invention can be implemented will be found in Cliff et al. U.S. Pat. No. 5,689,195, Cliff et al., U.S. Pat. No. 5,909,126, and Sung et al., U.S. Pat. No. 6,177,844, and Jefferson, et al., U.S. Pat. No. 6,215,326, all of which are hereby incorporated by reference herein in their entireties.

Figure 2:
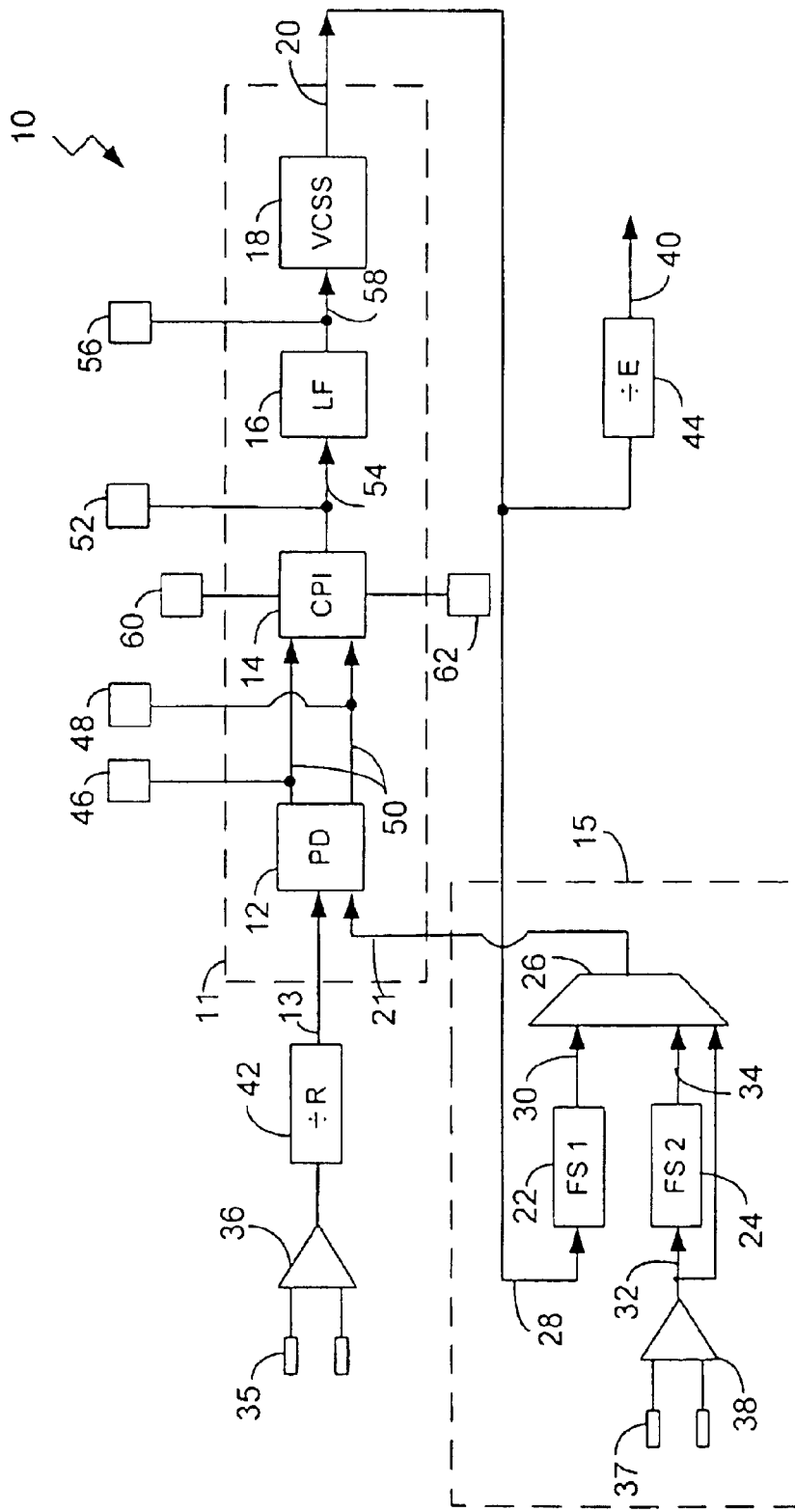
FIG. 2 is an illustrative more detailed schematic block diagram of PLL/DLL circuitry in accordance with a present embodiment of the invention.

The illustrative drawing of FIG. 2 shows additional details of a first PLL/DLL circuit 10 that can be implemented in an IC such as that of FIG. 1 in accordance with a presently preferred embodiment of the invention. The PLL/DLL 10 is formed as a part of an integrated circuit. The PLL/DLL 10 includes on-chip feedforward circuitry shown within dashed lines 11. The PLL/DLL 10 also includes on-chip feedback circuitry shown within dashed lines 15. The PLL/DLL 10 includes clock signal input driver circuitry 36, external feedback signal input driver circuitry 38 and a PLL/DLL output connection 40. Although device 36 shows the input clock to be differential, a single ended clock can be supported as an alternative consistent with the invention.

The on-chip feedforward circuitry 11 includes phase-frequency detector circuitry 12, charge pump circuitry 14, loop filter circuitry 16 and a loop controlled signal source (LCSS) 18 connected as shown. The phase-frequency detector circuitry 12 includes a clock input 13 and a feedback input 21. The phase-frequency detector clock input 13 is connected to receive a clock signal frequency. The phase-frequency detector feedback input 21 is connected to receive a feedback signal frequency. In a present embodiment, a reference counter 42 is connected to receive a clock signal provided to the input driver circuitry 36 and to provide a frequency-adjusted clock signal to the phase-frequency detector input 13. An external signal adjustment counter 44 is connected to receive a VCO output provided to the VCO output 20 and to provide a frequency-adjusted VCO output signal to the output connection 40.

As explained above, for convenience PLL and DLL circuitry in accordance with the invention are sometimes referred to generically herein as PLL/DLL circuitry. In a PLL circuit in accordance with the invention, the LCSS 18 comprises a VCO. In a DLL circuit in accordance with the invention, the LCSS 18 comprises a voltage controlled delay line (VCDL). Otherwise, PLL circuitry and DLL circuitry in accordance with a presently preferred embodiment of the invention are the same. Sung, et al. U.S. Pat. No. 6,177,844, which is expressly incorporated herein by this reference, describes details of VCO and VCDL implementations of PLL/DLL circuitry in accordance with a present embodiment of the invention. It will be appreciated that the principles of the invention may be practiced with PLL/DLL circuitry that employs an LCSS 18 that is current controlled rather than voltage controlled.

The on-chip feedback circuitry 15 includes first frequency selection circuitry 22 and includes second frequency selection circuitry 24 and includes multiplex circuitry 26 that acts either to select a first feedback signal provided by the first frequency selection circuitry 22 or to select a second feedback signal provided by the second frequency selection circuitry 24. An input 28 of the first frequency selection circuitry 22 is connected to be responsive to a LCSS feedback signal produced on VCO output 20 by the LCSS 18. An output 30 of the first frequency selection circuitry 22 provides the first feedback signal. When the multiplex circuitry 26 selects the first feedback signal, the first selection circuitry 22, provides the selected signal on the phase-frequency detector feedback input 21. An input 32 of the second frequency selection circuitry 24 is connected to be responsive to an external feedback signal. An output 34 of the second frequency selection circuitry 24 provides the second feedback signal. When the multiplex circuitry 26 selects the second feedback signal, the second selection circuitry 24 provides the selected signal on the phase-frequency detector feedback input 21.

The external feedback signal is produced by a signal source that can on-chip or off-chip. The external feedback signal can be generated by LCSS 18 connected to one or more external feedforward components, such as an external loop fitter, for example. Alternatively, the external feedback signal may be provided by an external (off-chip) LCSS.

In a locked condition PLL/DLL circuit components generally operate as follows. A phase-frequency detector produces a signal that is proportional to a phase difference $\Delta\phi$ which is constant over time. A charge pump produces an UP/DOWN control signal in response to the phase-frequency detector signal. A loop filter suppresses high frequency components of the phase-frequency detector/charge pump control signal, allowing the DC value to control the frequency of the signal produced by a LCSS. The LCSS then produces a signal having a frequency equal to the reference frequency and with a phase difference equal to $\Delta\phi$.

More particularly, in operation the function of the phase-frequency detector circuitry 12 is to generate on phase-frequency detector output 50 a signal waveform based on the difference in phase (and frequency) between a reference clock signal on phase-frequency detector input 13 and the phase-frequency feedback signal on input 21. More specifically, in one embodiment, for example, when the rising edge of the reference clock signal on input 13 leads that of the feedback signal on input 21, an UP signal is generated on output 50 which causes an increase in frequency of the feedback signal on input 21. Conversely, in one embodiment, for example, when the rising edge of the reference clock signal on input 13 lags that of the feedback signal on input 21, a DOWN signal is generated on output 50 which causes a decrease in frequency of the feedback signal on input 21. A pulse width of the UP/DOWN signal is proportional to the phase difference between the reference clock signal on input 13 and the feedback signal on input 21.

In operation, the function of the charge pump circuitry 14 is to provide a transfer function for converting the UP and Down signals to an output voltage signal on charge pump output 54 at a level between VCC (the power supply voltage of the IC device 100) and ground. The UP and DOWN signals switch an internal current source to deliver a charge to move the output voltage on output 54 up or down during each clock cycle.

In operation, the function of the loop filter 116 is to smooth the charge pump output signal on output 54 and to provide the smoothed signal to the VCO input 58. In one embodiment, the loop filter 16 serves as a low pass filter which filters out high frequency harmonics and provides a DC signal output.

In operation, the function of the LCSS 18 is to respond to the output signal of the charge pump 14, as filtered by the loop filter 16, and to provide an output clock on output 20 having a frequency and phase (relative to the reference clock signal on input 13) required to achieve synchronism between the inputs 13 and 21 to the phase-frequency detector 12.

In operation, the feedback circuitry 15 functions to produce a feedback signal on phase-frequency detector input 21 that causes the LCSS output signal to have a frequency that is derived from the reference clock signal frequency on phase-frequency detector input 13. In a present embodiment of the invention, the first selection circuitry 22 includes programmable counter circuitry that is programmable to produce a first programmable feedback signal which, when selected by the multiplex circuitry 26 for provision on input 21, causes the LCSS 18 to produce a signal that has a frequency that is a programmable multiple of the reference clock signal frequency on input 13. Also, in a present embodiment of the invention, the second frequency selection circuitry 24 includes programmable counter circuitry that is programmable to produce on a second programmable feedback signal which, when selected by the multiplex circuitry 26 for provision on input 21, causes a LCSS (either LCSS 18 or an external LCSS) to produce a signal that has a frequency that is a programmable multiple of a reference clock frequency on input 13. In a present embodiment, the second frequency selection circuitry includes counter circuitry to dynamically change a counter modulus during phase locking so as to permit fine tuning of a lock frequency to relatively narrow frequency channels for RF applications, for example.

The LCSS controlled by the second frequency selection circuitry 24 can be the on-chip LCSS 18. Alternatively, in the case of a hybrid PLL/DLL circuit using on off-chip LCSS, the LCSS controlled by the second frequency can be such off-chip LCSS. Ordinarily, the second frequency selection circuitry 24 receives as an input signal on input 32, a LCSS output signal from LCSS 18, or in the case of a hybrid PLL/DLL circuit with an off-chip LCSS, from an off chip LCSS. It will be appreciated that, alternatively, the second frequency selection circuitry 24 could receive as an input signal, a signal derived from either of such on-chip or off-chip LCSS signals through frequency division, for example.

In general, a PLL/DLL is in a locked condition when the signals in its loop have reached a steady state. As explained above, the PLL/DLL circuit 10 can be configured as a stand-alone PLL/DLL circuit using all on-chip components. Alternatively, a hybrid PLL/DLL circuit can be configured that employs some on-chip components from the PLL/DLL 10 and that also employs other off-chip components that are not part of the PLL/DLL circuit 10. In either the stand-alone or the hybrid case, PLL/DLL phase-locking operation is essentially the same.

More specifically, the PLL/DLL 10 includes circuitry that facilitates connection of a hybrid feedforward circuit that comprises a combination of both on-chip components of the feedforward circuitry II and off-chip PLL/DLL feedforward circuit components that are not formed in the same integrated circuit in which the PLL/DLL 10 is formed. In particular, the PLL/DLL 10 includes externally accessible terminals 46, 48 connectable to a phase-frequency detector output 50. The PLL/DLL 10 includes an externally accessible terminal 52 connectable to a charge pump output 54. The PLL/DLL 10 includes an externally accessible terminal 56 connectable to a LCSS input 58.

In one embodiment, feedforward circuitry components that are unused in a hybrid feedforward circuit comprising both on-chip feedforward components and off-chip feedforward components can be gated off so as to not unnecessarily draw current or switch. For switched logic, gating off can be achieved by gating off the clock from such logic. For the charge pump 14, gating off can be achieved by turning off the devices that supply current by setting $V_{GS}=0$. For instance, if the charge pump 14 and the loop filter 16 are not to be a part of a given hybrid feedforward circuit, then the charge pump 14 can be gated off so that it becomes inoperative. Continuing with this same example, if the on-chip LCSS 18 is to be a part of the given hybrid feedforward circuit, then the LCSS 18 is not be gated off. In this example, it is expected that the external terminals 46, 48 would be connected to an external charge pump (not shown), and that the external terminal 56 would be connected to an external loop filter (not shown). It will be appreciated that other combinations of the feedforward circuitry components can be selectively gated off depending upon the design of the given hybrid feedforward circuitry.

Figures 8A, 8B:
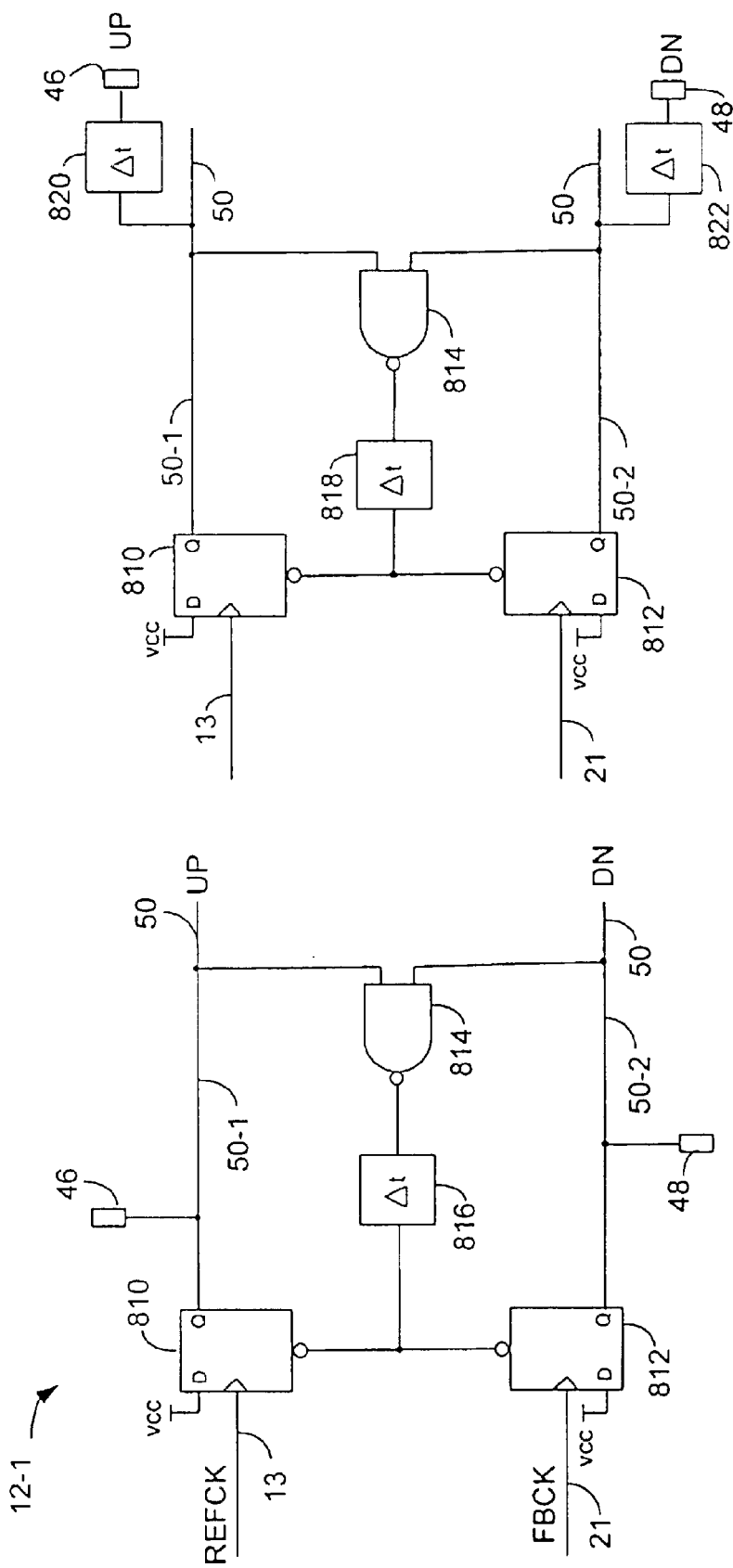
FIGS. 8A–8B are illustrative drawings of first and second phase-frequency detectors for use with current embodiments of the invention.

FIGS. 8A–8B are illustrative drawings that show details of alternative embodiments of the phase-frequency detector circuitry 12. FIG. 8A shows a first phase-frequency detector embodiment 12-1, and FIG. 8B shows a second phase-frequency detector embodiment 12-2. Components of the first and second phase-frequency detector embodiments of FIGS. 8A-8B that are identical are labeled with identical reference numerals. The first phase-frequency detector 12-1 includes first and second D flip-flops 810, 812 and a NAND gate 814. A clock input of the first D flip-flop 810 is connected to receive a reference clock signal frequency signal on line 13. A clock input of the second D flip-flop 812 is connected to receive a feedback signal on line 21. The D inputs of the first and second D Flip-flops 810, 812 are connected to a bias voltage, i.e. $V_{CC}$. A Q output of the first D flip-flop 810 on line 50-1 plus a Q output of the second D flip-flop 812 on line 50-2 comprise the PFD output 50. The first phase-frequency detector 12-1 also includes a programmable delay element 816 connected between the NAND gate output and the respective first and second D flip-flop clock inputs as shown. The programmable delay element 816, for example, can be implemented s a programmable delay line.

The overall operation of the first phase-frequency detector 12-1 will be readily understood by persons having ordinary skill in the art and need not be described herein. The programmable delay element 816 can be programmed to adjust the pulse widths of the UP and DOWN signals produced by the first phase-frequency detector 12-1. Referring to FIG. 2, if the on-chip charge pump 14 is to be used, then the delay imposed by the programmable delay element 816 can be programmed to cause the first phase-frequency detector 12-1 to produce UP/DOWN pulses of a lengths or durations suitable to control the on-chip charge pump 14. If on the other hand, an off-chip charge pump (not shown) is to be used, then the delay imposed by the programmable delay element 816 can be programmed to cause the first phase-frequency detector 12-1 to produce UP/DOWN pulses of a lengths or durations suitable to control such off-chip charge pump. Thus, the delay element 816 advantageously makes the PLL/DLL 10 more versatile by making it more readily adaptable for use with a wider variety of different charge pumps.

The second phase-frequency detector 12-2 differs from the first phase-frequency detector 12-1 in that the second detector 12-2 includes a fixed delay element 818 connected between the output of a NAND gate 814 and clock inputs to the D flip-flops 810, 812. Also, the second phase-frequency detector 12-2 differs from the first phase-frequency detector 12-1 in that the second detector 12-2 includes first and second external terminal delay elements 820 and 822 connected to external terminals 46, 48. The delay element 818 imparts a delay suitable to produce UP/DOWN signals of a duration suitable for the on-chip charge pump 14. The programmable delay elements 820, 822 can be programmed to adjust the pulse widths of the UP and DOWN signals produced on the external terminals 46, 48 by the second phase-frequency detector 12-2 to adapt it for use with any of different off-chip charge pumps (not shown).

It is believed that the use of the programmable element 814 of the first detector embodiment 12-1 may in some circumstances result in more electrical noise than the use of the first and second programmable delay elements 820, 822 of the second detector embodiment 122. More specifically, it is believed that the use of a fixed delay element 818 connected between the output of the NAND gate 814 and the clock inputs of the D flip-flops 810, 812 of the second embodiment 12-2 may result in less noise than the use of a programmable element 814 in the same circuit position in the first detector embodiment 12-1. However, the principle of operation of the these two phase-frequency detector embodiments 12-1, 12-2 are essentially the same.

Figure 3B:
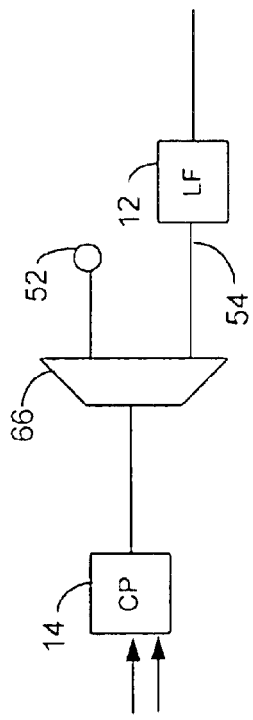
FIGS. 3A–3C are illustrative block diagram drawings respectively showing a selector circuit connecting a phase-frequency detector and the charge pump; a selector circuit connecting a charge pump and a loop filter; and a selector circuit connecting a loop filter and a LCSS of the PLL/DLL of FIG. 2.
Figure 3A:
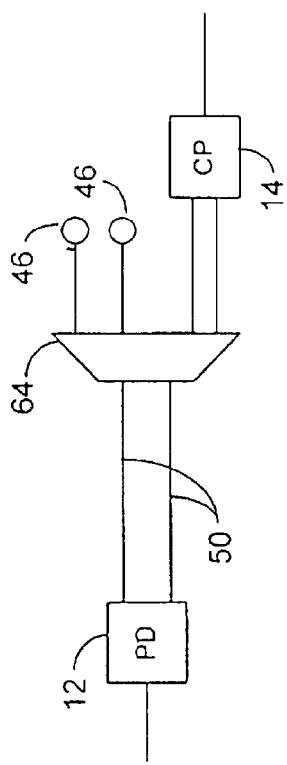
Figure 3C:
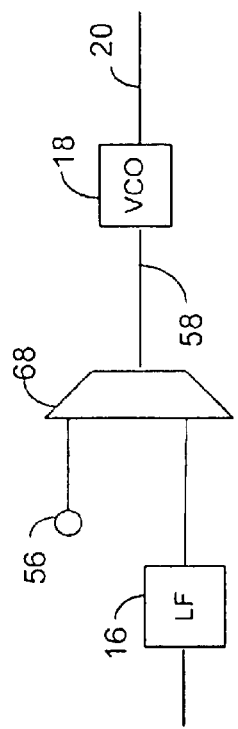

The illustrative drawings of FIGS. 3A-3C show portions of an alternative embodiment of the PLL/DLL circuit 10 of FIG. 2 in which selector circuits are used to selectively couple signals between on-chip feedforward components and other on-chip and off-chip components. Items in FIGS. 3A–3C that are identical to corresponding items in FIG. 2 are identified with reference numerals that are identical to the numerals used for corresponding items in FIG. 2. FIG. 3A is an illustrative drawing showing a selector circuit 64 connecting the phase-frequency detector 12 and the charge pump 14. The selector circuit 64 selectively couples PFD output signals on PFD output 50 to either the charge pump input or to external terminals 46, 48. It will be appreciated that if the PFD output signals on PFD output 50 are to be coupled to external terminals 46, 48, then the charge pump 14 is in effect not operative. FIG. 3B is an illustrative drawing showing a selector circuit 66 connecting the charge pump 14 and the loop filter 16. Selector circuit 66 selectively connects the charge pump output 54 to either the loop filter input or to external terminal 52. If the external terminal 52 is selected for connection to the charge pump output 54, then the loop filter 16 is in effect operatively disconnected from the charge pump 14. FIG. 3C is an illustrative drawing showing a selector circuit 68 connecting the loop filter 16 and the LCSS 18. Selector circuit 68 selectively couples signals received on external terminal 56 to an input of LCSS 18 or couples signals output by LF 16 to the input of LCSS 18. If the external terminal 56 is selected to provide signals to the LCSS input, then the LF 16 Is in effect not operative.

Figure 9:
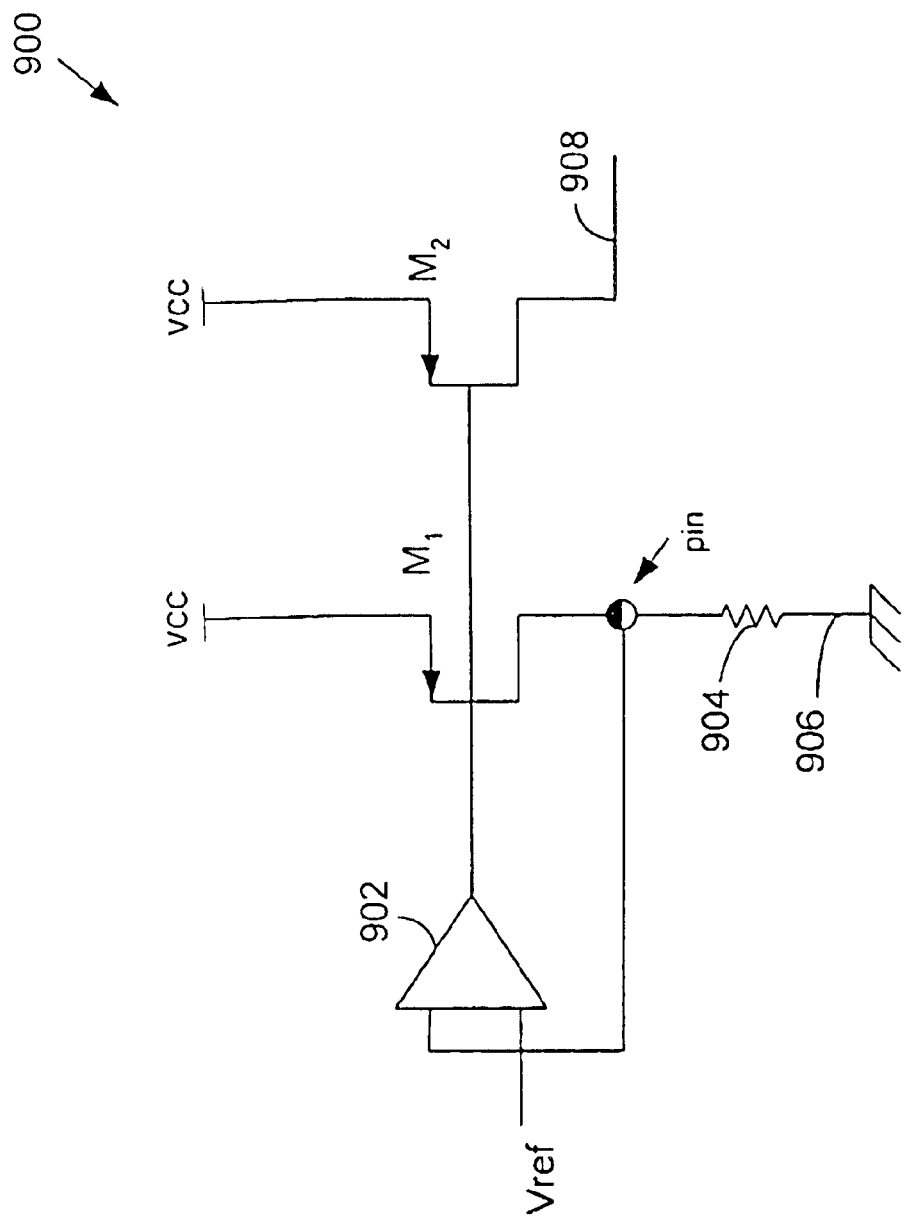
FIG. 9 is an illustrative diagram of a charge pump reference current circuit for use with the present embodiments of the invention.

The charge pump circuitry 14 is connectable to external bias terminals 60, 62. More specifically, the charge pump circuitry is implemented so that it can be powered either from internal core power of the integrated circuit on which the PLL 10 is formed or from an external power bank. Powering the charge pump 14 advantageously permits setting the power to a level appropriate for a given external loop filter or VCO, (e.g., 2.5V or 3.3V). Thus, providing external bias terminals for the charge pump circuitry 14 adds further flexibility to the use of the PLL 10. FIG. 9 is an illustrative drawing of a current reference circuit 900 that can be used to set a reference current for the on-chip charge pump 14 or for an off-chip charge pump (not shown). The circuit 900 includes a reference voltage source 902, first and second transistors M1, M2 and a resistor 904. One terminal of the reference voltage source 902 is connected to an on-chip voltage source such as a 1.25 volt band gap voltage. Another terminal of the reference voltage source 902 is connected to a source terminal of transistor M1. An output of the reference voltage source is connected to a gates of M1 and M2. A drain terminal of each of the first and second transistors M1, M2 is connected to a bias voltage, i.e. $V_{CC}$. A source terminal 906 of M1 is connected to ground through resistor 904. A source terminal 908 of M2 provides a charge pump reference current.

The reference current has a value as follows.

$$I_{reference} = (W_2/L_2)/W_1/M_1)$$

$W_2/L_2$ represent the length and width dimensions of transistor $M_2$. $W_1/L_1$ represent the length and width dimensions of transistor $M_1$.

If the internal charge pump 14 is to be employed, the reference current is provided internally to the charge pump 14. It will be appreciated that although resistor 904 is shown as a single resistor element, it may be implemented as multiple transistor element, and may be programmable in value. Moreover, resistor 904 may be externally selectable or insertable so as to produce a reference current suitable for an external charge pump.

It will appreciated, for example, that in a given hybrid feedforward circuit the on-chip charge pump 14, loop filter circuitry 16 and the LCSS 18 all can be inoperative at one time. Alternatively, in other hybrid feedforward circuits, for example, only the on-chip loop filter circuitry 16 might be inoperative or only the loop filter circuitry 16 and the LCSS 18 might be inoperative. Thus, a PLL/DLL can be implemented using an off-chip loop filter (not shown), for example, that is too large to fit on-chip with other PLL/DLL components but is well suited to low bandwidth applications such as RF communications.

In other words, a hybrid external feedback signal source can be implemented using a combination of on-chip feedforward circuitry components and external (off-chip) components that is most suitable to a given application. In a current embodiment of the invention, it is contemplated that an external feedback signal provided to input driver circuitry 38 can be produced, at least in part, using feedforward circuit components external to the integrated circuit on which the PLL/DLL 10 is formed. In other words, an external feedback signal source can be implemented using only some of the on-chip components of the feedforward circuitry 11 of the PLL/DLL 10.

Figure 4B:
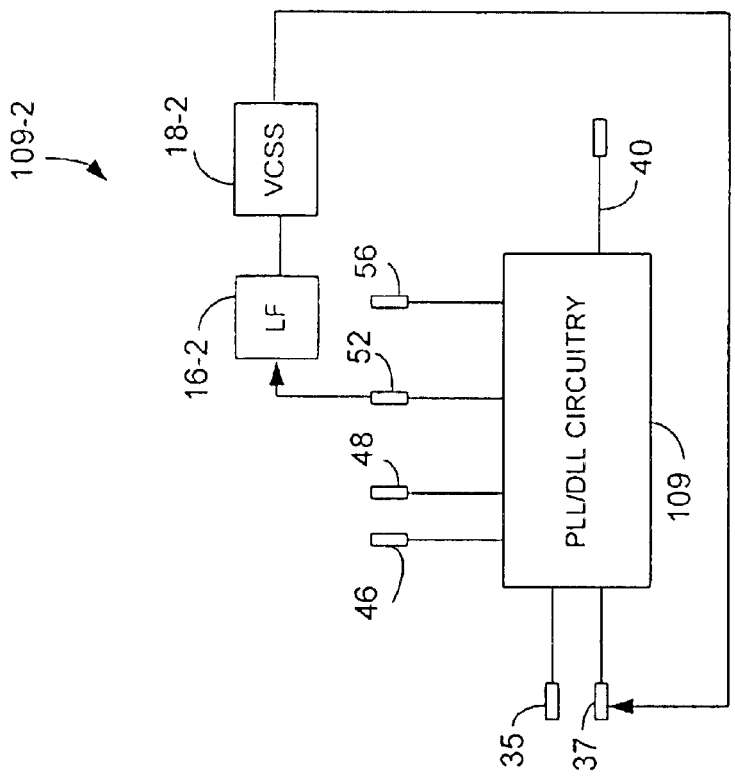
FIGS. 4A–4B are generalized illustrative block diagrams of first and second examples of hybrid PLL/DLL circuits incorporating components of the PLL/DLL circuitry of FIG. 2 and also incorporating PLL/DLL feedforward circuit components external to the PLL/DLL circuitry of FIG. 2.
Figure 4A:
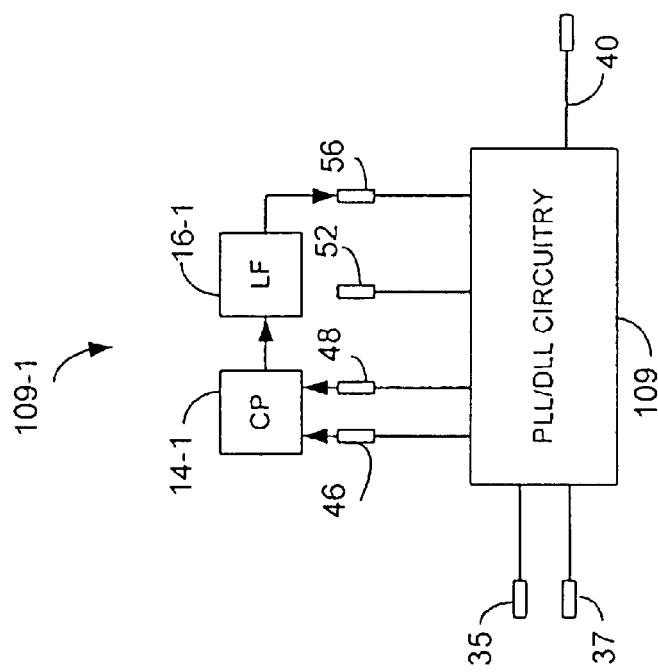

Referring to the illustrative drawings of FIGS. 4A–4B, there are shown first and second hybrid PLL/DLL circuits 109-1 and 109-2, respectively. Each of hybrid circuits 109-1 and 109-2 includes the PLL/DLL circuitry 109 of FIG. 2 which is shown as a single block in each of FIGS. 4A and 4B. Referring to both FIG. 2 and FIG. 4A, selection circuitry of PLL/DLL circuitry 109 is switched to couple signals from the phase-frequency detector 12 to external terminals 46, 48 which are connected to an external charge pump 14-1. The external charge pump 14-1 is connected to an external loop filter 16-1. The selection circuitry of the PLL/DLL circuitry 109 is switched to couple signals provided by the external loop filter 16-1 on the external terminal 56 to an input of LCSS 18. Referring to both FIG. 2 and FIG. 4B, selection circuitry of PLL/DLL circuitry 109 is switched to couple signals from the charge pump 14 to external terminals 46, 48 which are connected to an external loop filter 16-2. The external loop filter 16-2 is connected to an external LCSS 18-2 which has an output connected to provide signals to an external feedback input terminal 37.

It will be appreciated that selection circuitry is used to configure PLL/DLL 10 to operate in a stand-alone mode or to operate as part of a hybrid PLL/DLL circuit. In accordance with different embodiments of the invention, the selection circuitry may include selector circuits 64, 66, 68 such as those described with reference to FIGS. 3A–3C. Alternatively, the selection circuitry may include circuitry to gate off circuit components that are not currently in use. Alternately, the selection circuitry may include both selector circuits 64, 66, 68 and circuitry for gating off. In the embodiments of FIGS. 3A–3C, the selector circuits 64, 66, 68 switchably interconnect feedforward components and switchably couple signals between them and/or external terminals.

Figure 5:
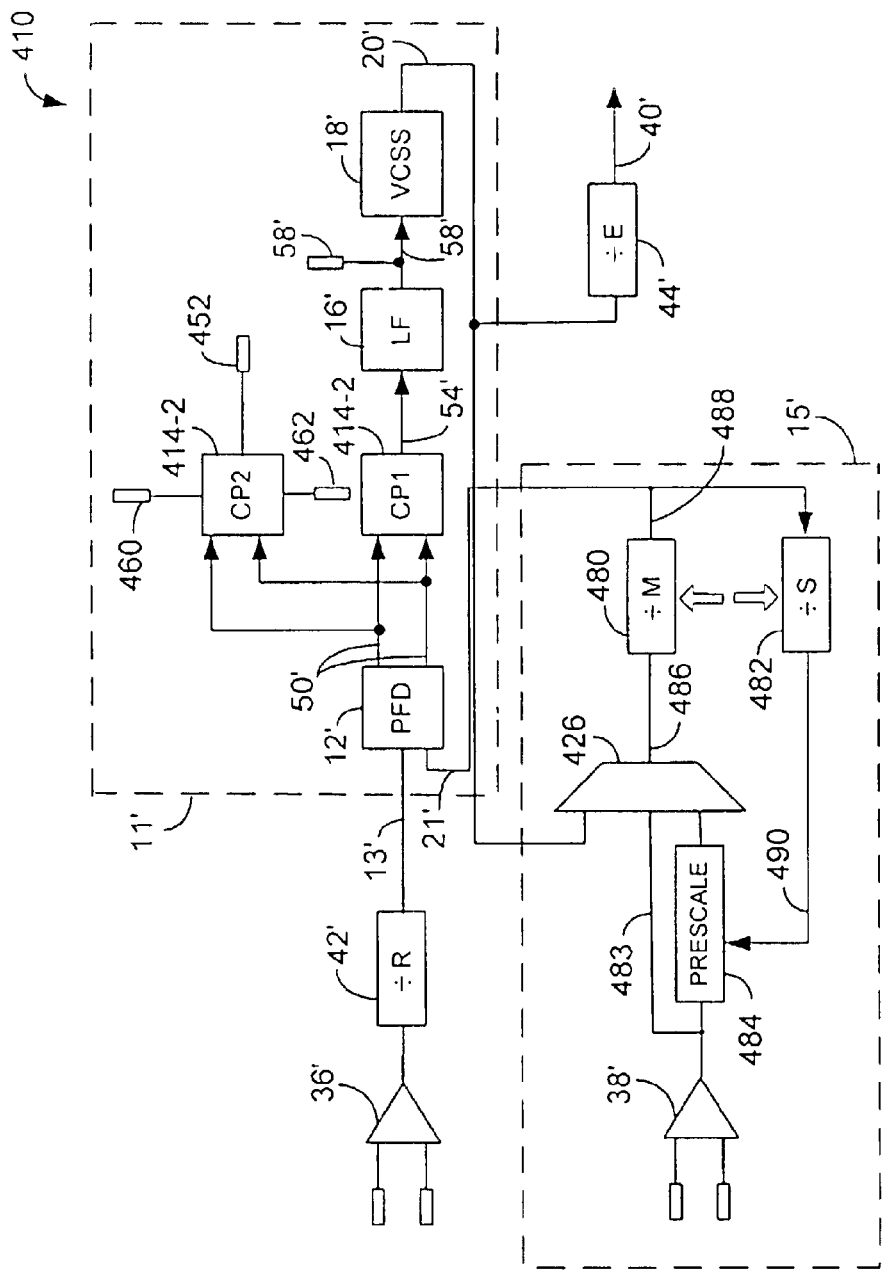
FIG. 5 is an illustrative detailed schematic block diagram of PLL/DLL circuitry in accordance with an alternative embodiment of the invention which includes integer-N feedback circuitry.

FIG. 5 is an illustrative drawing that shows a second embodiment of a PLL/DLL circuit 410 in accordance with the invention. Items in that are the same in FIGS. 2 and 4 are labeled with the same reference numerals which are primed in FIG. 5. Only those aspects of the embodiment of FIG. 5 that are different from the embodiment of FIG. 2 shall be described. The feedforward circuitry 11' of the second PLL/DLL 410 includes both first charge pump circuitry 414-1 and second charge pump circuitry 414-2. Both the first and second charge pump circuitry 414-1, 414-2 are connected to the phase-frequency detector output 50'. The first charge pump circuitry 414-1 is connected to the loop filter 16'. The second charge pump circuitry 414-2 is connected to an external terminal 452 that can be connected to an off-chip loop filter. The second charge pump circuitry 414-2 is connected to external bias terminals 460, 462.

Figure 6:
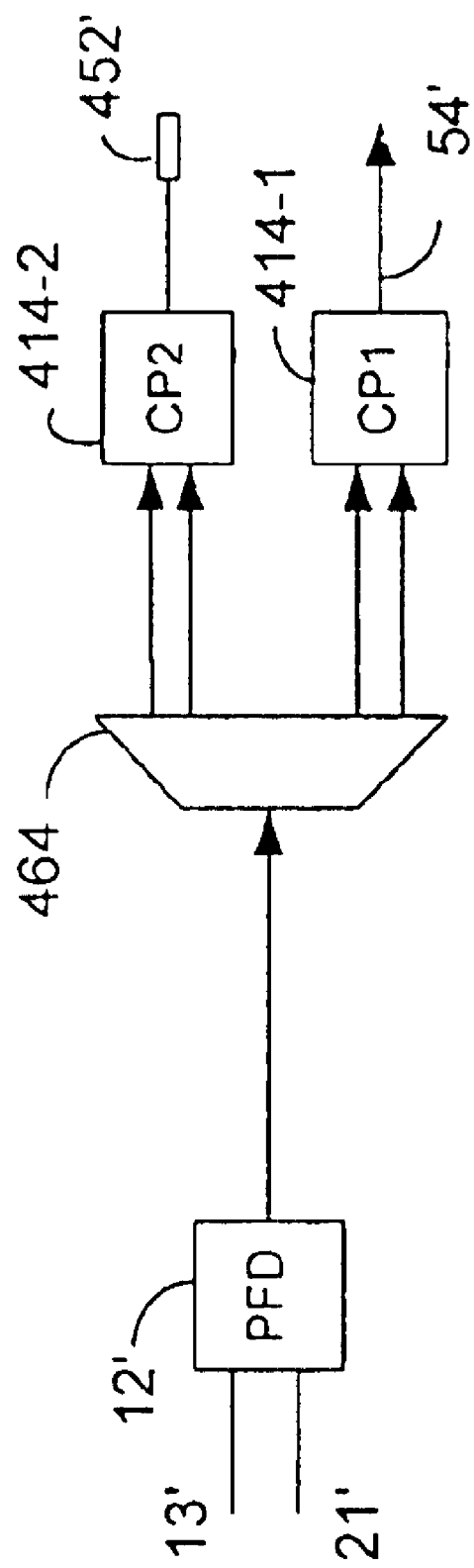
FIG. 6 is an illustrative block diagram of one embodiment of selection circuitry connecting first and second charge pump circuitry to a phase-frequency detector in the embodiment of FIG. 5.

The illustrative drawing of FIG. 6 shows that the first and second charge pump circuitry 414-1, 414-2 are connected to the phase-frequency detector 12' through a selector circuit 464. The selector circuit 464 can be switched to couple signals on the PFD output 50 either to the first charge pump 414-1 or the second charge pump 414-2. The second charge pump 414-2 can be connected to an external loop filter via terminal 452. Tile external bias terminals 460, 462 can be used to bias the second charge pump 414-2 to a correct value (e.g., 2.5V or 3.3V) for interfacing with a desired external loop filter and LCSS. Moreover, circuitry the first or second charge pump 414-1 or 414-2 can be gated off from the LCSS 18' by setting its $V_{GS}$ to zero to turn it off and to thereby save power when not in use in the PLL/DLL 410.

FIG. 5 also shows details of the feedback circuitry 15'. The drawings of the feedback circuitry 15' of FIG. 5 show in detail one implementation of the feedback circuitry 15' that FIG. 2 illustrates more generally. In the embodiment of FIG. 5, first frequency selection circuitry is implemented so as to produce a first feedback signal that causes the LCSS 18' of PLL 410 to produce an output signal having a frequency that is equal to the reference clock signal frequency on input 13' multiplied times M, where M is a programmable integer. In the embodiment of FIG. 5, the second frequency selection circuitry is implemented as an Integer-N feedback circuit that produces a second feedback signal that causes a LCSS to produce a signal having a frequency that is equal to the reference clock frequency on input 13' multiplied times (PN+S) where P, N and S are programmable integers.

More specifically, the feedback circuitry 15' includes first frequency selection circuitry which includes a programmable modulus-counter 480 and includes second frequency selection circuitry which includes a programmable swallow-counter 482, a programmable prescale-counter 484 and the modulus-counter 480. The feedback circuitry 15' also includes multiplex circuitry 426. The modulus counter 480 is shared by the first and second frequency selection circuitry. The multiplex circuitry 426 connects the first and second frequency selection circuitry and an external feedback input driver 38' to PFD feedback input 21'. The multiplex circuitry 426 is switchable to couple to the PFD feedback input 21' either a first feedback signal provided by the first frequency selection circuitry or a second feedback signal provided by the second frequency selection circuitry or an external feedback signal received by the external feedback input driver 38'. Moreover, the multiplex circuitry 426 is switchable to couple to an input of modulus-counter 480 either an output signal provided by LCSS 18' on LCSS output 20' or an external feedback signal provided on driver 38' and conducted around the prescale counter 484 via bypass connection 483.

In operation, when the first frequency selection circuitry is selected for operation with feedback input from LCSS 18', the multiplex circuitry 426 couples a LCSS output signal on LCSS output 20' to an input 486 to the modulus-counter 480. The modulus counter 480 produces on its output 488 one output clock pulse for every M clock pulses of the LCSS output signal received on the modulus-counter input 486. Similarly, when the first frequency selection circuitry is selected for operation with feedback input from an external periodic feedback signal source, the multiplex circuitry 426 couples a the signal received at feedback input 38' to an input 486 to the modulus-counter 480. The modulus counter 480 produces on its output 488 one output clock pulse for every M clock pulses of the signal received on the modulus-counter input 486.

When the second frequency selection circuitry is selected for operation, the multiplex circuitry 426 couples an external feedback signal received by the external feedback driver input 38' to an input of the prescale-counter 484. It will be appreciated that an external feedback signal may be produced by the on-chip LCSS 18' or by an external off-chip clock signal source (not shown). In a present embodiment the prescale-counter 484 (counts and thereby) divides an external feedback input signal by either N or N+1 according to the logical state on control line 490. The programmable modulus-counter 480 (counts and thereby) divides a signal output by the prescale-counter by M. The programmable swallow-counter 482 (counts and thereby) divides the output of prescale-counter 480 by S. The integer S can vary from the number 1 to a maximum number of frequency channels for example. Thus, through the operation of the swallow-counter 482, the modulus of the pre-scale counter 484 changes dynamically during phase locking.

In more general terms, it will be appreciated that the second frequency selection circuitry causes the source of the external feedback signal (e.g., LCSS 18' or an external LCSS) to have a frequency $F_{out}$ generally represented by, $$F_{out}=M*F_{REF}+kF_{REF}$$

Where $F_{REF}$ is the frequency of the reference clock signal on input 13', and where the second frequency selection circuitry in effect has a variable modulus $M^*=M_V+k$, where k=0, 1, . . . N, and $M_V$ is variable in unity steps, but $M_V$ is fixed for any set of adjacent channels $M_V+1k$, $M_V+2k$ . . . $M_V+Nk$. Thus, each different value of $M_V$ represents a frequency band, and $M_V+1k$ through $M_V+Nk$ represent different discrete frequencies within that frequency band.

Figure 7:
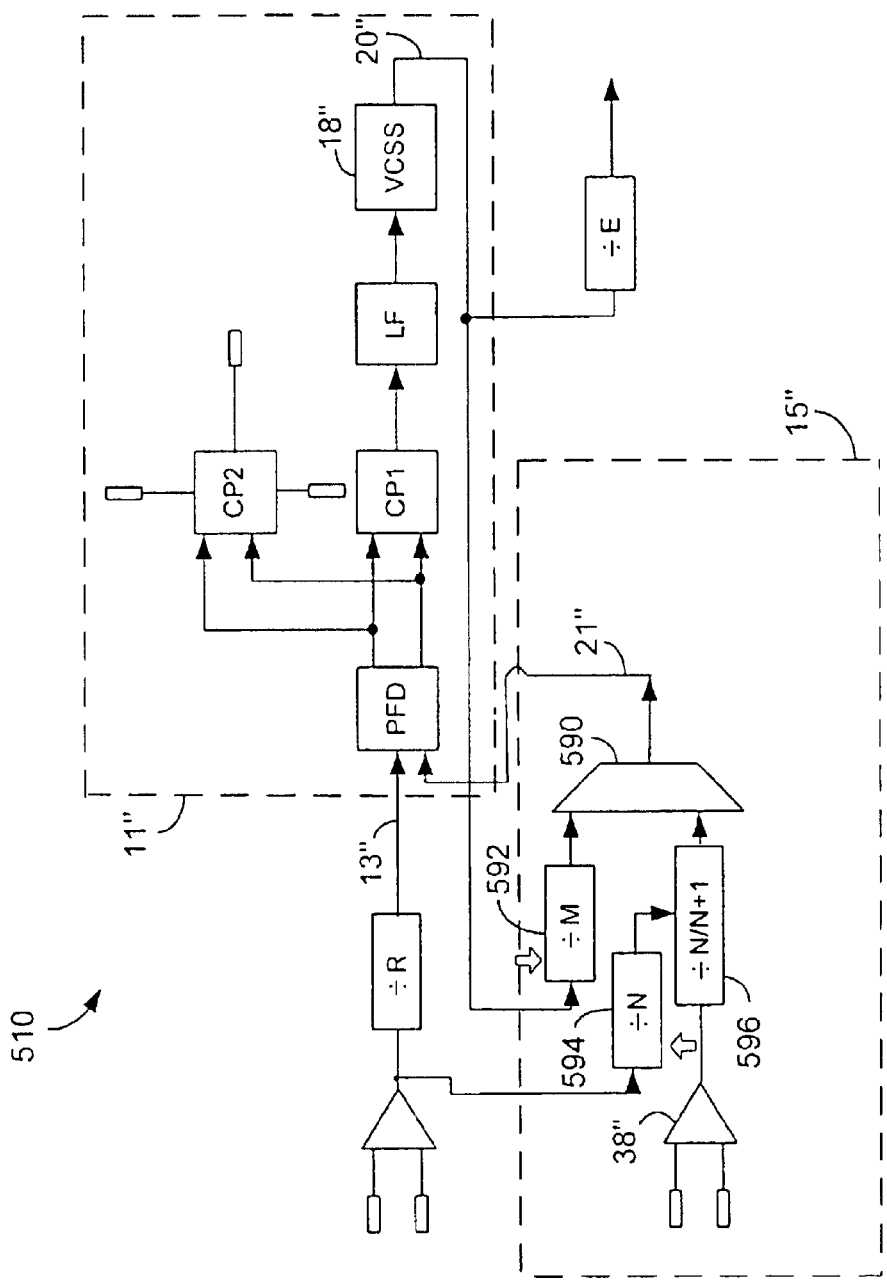
FIG. 7 is an illustrative detailed schematic block diagram of PLL/DLL circuitry in accordance with another alternative embodiment of the invention which includes fractional-N feedback circuitry.

FIG. 7 is an illustrative drawing that shows a third embodiment of a PLL/DLL circuit 510 in accordance with the invention. Items in that are the same in FIGS. 2 and 7 are labeled with the same reference numerals which are double primed in FIG. 7. Only those aspects of the embodiment of FIG. 7 that are different from the embodiments of FIGS. 2 and 4 shall be described. It will be understood that the third PLL/DLL 510 may include selector circuitry like that of FIG. 5.

FIG. 7 also shows details of the feedback circuitry 15". The drawings of the feedback circuitry 15" of FIG. 7 show in detail one implementation of the feedback circuitry 15 that FIG. 2 illustrates more generally. In the embodiment of FIG. 7, first frequency selection circuitry is implemented with a programmable modulus-counter 592 connected so as to produce a first feedback signal that causes the LCSS 18" of PLL/DLL 510 to produce an output signal having a frequency that is equal to the reference clock signal frequency on input 13" multiplied times M, where M is a programmable integer. In the embodiment of FIG. 7, the second frequency selection circuitry is implemented as a fractional-N feedback circuit. The fractional-N feedback circuit includes a programmable modulus-control-counter 594 and a prescaler-counter 596. The modulus control-counter 594 has an input connected to receive the reference signal on input 13" and has an output connected to control a divide-modulus of the prescale-counter 596. The prescale-counter 596 divides an external feedback signal on input 38" by N or by N+1 depending upon the control signal provided on its modulus control input. The modulus-control-counter 596 can be programmed so as to cause a second feedback signal that causes a frequency source (e.g., LCSS 18" or an external frequency source) to have a frequency that is a factional multiple of the reference signal. Specifically, the modulus-control-counter 596 can be programmed so that the prescale-counter 594 divides by N for A pulses of the frequency source (either VCO 18" or an external frequency source) and so that the prescale-counter 594 divides by N+1 for B pulses of the frequency source. Thus, through the operation of the modulus-control-counter 596, the modulus of pre-scale counter 594 changes dynamically during phase locking.

As a result, frequency source is caused to produce an external feedback signal having a frequency, $F_{out}=(A+B)/[A/N+B/(N+1)]F_{REF}$ More generally, the resulting frequency can be represented as, $F_{out}=[N*.f]F_{REF}$, where the dot represents a decimal point and N and $f$ represent integer and fractional parts of the modulus. The spacing between discrete frequencies that can be produced by the fractional-N feedback circuitry is a factional multiple of the reference signal, and that fractional multiple depends upon the modulus of programmed into the modulus-control counter 594.

When the first frequency selection circuitry of FIG. 7 is selected for operation with feedback input from LCSS 18", the multiplex circuitry 590 couples an output signal produced by the modulus-counter 592 to PFD input 21". The modulus counter 592 produces on its output one output clock pulse for every M clock pulses of the VCO output signal received on the modulus-counter input. When the second frequency selection circuitry of FIG. 7 is selected for operation, the multiplex circuitry 590 couples an output signal produced by the prescale-counter 596 to PFD input 21".

Various modifications to the preferred embodiments can be made without departing from the scope of the invention. Thus, the foregoing descriptions are not intended to limit the invention which is described in the appended claims.

What is claimed is:

1. An integrated circuit including a phase lock loop circuit comprising:

a clock input terminal for accepting a clock signal;

a phase/frequency detector (PFD) circuit including a clock input connected to receive the clock signal and including a feedback input for receiving a PFD feedback signal and including a PFD output for providing a PFD output signal;

a first charge pump (CP) circuit including a first CP input connected to receive the PFD output signal and including a first CP output for providing a first CP output signal;

at least one external feedforward output terminal connectable to couple at least one of the PFD output signal and a CP output signal to an external loop filter;

a loop filter (LF) including a filter input connected to receive the first CP output signal and including a LF output for providing a LF output signal;

a loop controlled signal source (LCSS) including a LCSS input connected to receive a LF output signal and including a LCSS output for providing a LCSS output signal; and a feedback circuit connected between the LCSS output and the PFD feedback input, the feedback circuit including, an external feedback input terminal;

selector circuitry including a first feedback selection input connected to receive the LCSS output signal and including a second feedback selection input and including a selection output for providing a selection output signal;

a programmable program counter (PC) including a PC input connected to receive the selection input signal and including a PC output connected to provide a PFD feedback signal to the PFD feedback input;

a programmable swallow counter which includes a swallow counter input connected for receiving the PFD feedback signal and which includes a swallow counter output for providing a prescaler control signal; and a programmable prescaler counter including a control input connected to receive the prescaler control signal and including a feedback input connected to receive a signal from the external feedback input terminal and including a prescaler output connected to provide a prescaler signal to the second feedback selection input.

2. The integrated circuit of claim 1 further including:

a programmable reference counter connected to adjust the clock signal frequency and including an input connected to the clock input terminal and an output connected to provide the frequency adjusted clock signal to the PFD clock input.

3. The integrated circuit of claim 1, wherein the selector circuit includes an other external feedback input; and further including:

a bypass connection between the external feedback input terminal and the other external feedback input of the selection circuit, the bypass connection bypassing the programmable prescaler counter.

4. The integrated circuit of claim 1 further including, a first external bias terminal;

a second external bias terminal; and a selector circuit connecting the first charge pump output to the LF and to an external feedforward output terminal; and wherein the first CP is interconnected with the first and second external bias terminals.

5. The integrated circuit of claim 1 further including:

a second charge pump (CP) circuit including a second CP input connected to the PFD output and including a second CP output; and wherein the second CP output serves as an external feedforward output terminal.

* * * * *